(12) United States Patent
Popovich (10) Patent No.: US 7,219,715 B2
(45) Date of Patent: May 22, 2007

(54) COOLING SYSTEMS INCORPORATING HEAT TRANSFER MESHES

(75) Inventor: John M. Popovich, Solana Beach, CA (US)

(73) Assignee: Onscreen Technologies, Inc., Portland, OR (US)

( * ) Notice: Subject to any disclaimer, the term of this patent is extended or adjusted under 35 U.S.C. 154(b) by 0 days.

(21) Appl. No.: 11/314,433

(22) Filed: Dec. 20, 2005

(65) Prior Publication Data

US 2006/0137856 A1    Jun. 29, 2006

Related U.S. Application Data

(60) Provisional application No. 60/641,399, filed on Jan. 5, 2005, provisional application No. 60/641,423, filed on Jan. 5, 2005, provisional application No. 60/638,809, filed on Dec. 23, 2004.

(51) Int. Cl.
*F28F 7/00* (2006.01)
(52) U.S. Cl. ................... 165/80.4; 165/104.33
(58) Field of Classification Search ........... 165/80.4, 165/80.5, 104.33, 104.28; 361/699
See application file for complete search history.

(56) References Cited

U.S. PATENT DOCUMENTS

| | | | |
|---|---|---|---|
| 4,241,277 A | 12/1980 | Hintze et al. | |
| 4,394,600 A | 7/1983 | Flannagan | |
| 4,937,654 A | 6/1990 | Hirabayashi | |
| 5,059,373 A | 10/1991 | Hirabayashi | |
| 5,427,174 A * | 6/1995 | Lomolino et al. | ..... 165/104.13 |
| 5,471,371 A | 11/1995 | Koppolu et al. | |
| 5,478,778 A | 12/1995 | Tanisawa | |
| 5,550,721 A | 8/1996 | Rapisarda | |
| 5,632,551 A | 5/1997 | Roney et al. | |
| 5,719,444 A * | 2/1998 | Tilton et al. | ................. 257/714 |
| 5,746,497 A | 5/1998 | Machida | |
| 6,116,759 A | 9/2000 | Smith | |
| 6,175,342 B1 | 1/2001 | Nicholson et al. | |
| 6,238,056 B1 | 5/2001 | Rapisarda | |
| 6,283,613 B1 | 9/2001 | Schaffer | |
| 6,390,643 B1 | 5/2002 | Knight | |
| 6,402,347 B1 | 6/2002 | Maas et al. | |
| 6,480,389 B1 | 11/2002 | Shie et al. | |
| 6,652,127 B2 | 11/2003 | Tarabula | |
| 6,831,305 B2 | 12/2004 | Yasukawa et al. | |
| 2002/0074557 A1 | 6/2002 | Uda et al. | |
| 2003/0048912 A1 | 3/2003 | Reich | |
| 2003/0063463 A1 | 4/2003 | Sloan et al. | |
| 2003/0098460 A1 | 5/2003 | Yasukawa et al. | |

(Continued)

FOREIGN PATENT DOCUMENTS

EP      377352 A1    7/1990

(Continued)

*Primary Examiner*—Teresa J. Walberg
(74) *Attorney, Agent, or Firm*—William W. Haefliger (57) ABSTRACT

Apparatus for cooling of an electrical element package, comprising in combination structure including a hollow body, defining a cavity containing cooling fluid, the structure defining an opening or passage whereby direct contact of the cooling fluid with the package is established for heat transfer from the package to the fluid contained in the cavity; a mesh located to enhance the heat transfer, and means for circulating the fluid to transfer heat to other heat transfer means acting to remove heat from the fluid.

37 Claims, 9 Drawing Sheets

U.S. PATENT DOCUMENTS

2003/0112627 A1   6/2003   Deese

FOREIGN PATENT DOCUMENTS

| | | |
|---|---|---|
| JP | 57095682 | 6/1982 |
| JP | 04290478 A | 10/1992 |
| JP | 05072978 A | 3/1993 |
| JP | 05074975 A | 3/1993 |
| JP | 05134615 A | 5/1993 |
| JP | 06151915 A | 5/1994 |
| JP | 06314863 A | 11/1994 |
| JP | 2003223121 A | 8/2003 |

* cited by examiner

COOLING SYSTEMS INCORPORATING HEAT TRANSFER MESHES

This application incorporates provisional application Ser. Nos. 60/638,809, filed Dec. 23, 2004, 60/641,399, filed Jan. 5, 2005, and 60/641,423, filed Jan. 5, 2005.

BACKGROUND OF THE INVENTION

This invention relates generally to efficient cooling of apparatus such as electrical apparatus, and more particularly to highly efficient heat transfer means, including wire mesh defining tortuous flow path passages for coolant fluid, in closely assembled relation to the electrical apparatus or its package.

There exists in industry great need for efficient, compact, and simple heat transfer means as referred to above. Prior heat techniques and devices provided for such cooling lacked the unusual advantages in structure, functioning, and results as are now provided by apparatus as disclosed herein.

SUMMARY OF THE INVENTION

It is a major object of the invention to provide simple, and compact heat transfer apparatus meeting the above need. Basically, the improved apparatus comprises:

a) structure including a hollow body, defining a cavity containing cooling fluid, b) the structure defining an opening or passage whereby direct contact of the coolant fluid with a circuit package is established for heat conduction from the package to the fluid contained in the cavity, a heat connective mesh being provided in the path of flow of the coolant fluid, c) and means for circulating the fluid to transfer heat to heat transfer means acting to remove heat from the fluid.

Another object includes provision of mesh structures, such as micro-mesh, associated with the referenced opening or passage, in the path of fluid circulation to enhance such heat transfer as fluid flows through tortuous passages defined by the mesh. The mesh typically extends over or cross-wise of the opening or passage, and may have a dutch weaving strand pattern defining an efficient, tortuous coolant flow path or pattern. In addition, a fluid seal or seals is or are provided to seal off between surfaces on the body and package, adjacent the opening.

Yet another object is to provide a pump acting to displace the fluid along a circulation path, associated with the cavity. In this regard, the pump may be located in, or exposed to, the fluid in the cavity, and preferably has moving surfaces acting as fluid shear creating surfaces, during pumping. A pump motor may be located outside the cavity, and magnetic coupling can provide for transmission of torque from the motor to the pump.

A further object includes provision of a housing for the body and motor, provision of heat transfer fins on the housing to receive heat transferred from the fluid to the housing, and means to displace cooling gas in cooling relation with the fins.

A yet further object includes provision of heat transfer apparatus including a) a source of heat from electrical equipment, and having a heat transfer surface, b) a wire mesh extending proximate that surface to receive heat transfer therefrom, the mesh including certain wires that undulate, and other wires, said certain and other wires forming interstices, c) and means for passing a coolant fluid generally parallel to the mesh, and through the interstices, to receive heat transfer from the mesh.

As will be seen, coolant fluid may be guided to flow in and parallel to the mesh; a second heat transfer mesh may be provided to receive the coolant fluid; and a heat receiver with cooling fins may receive heat from the second mesh.

These and other objects and advantages of the invention, as well as the details of an illustrative embodiment, will be more fully understood from the following specification and drawings, in which:

DRAWING DESCRIPTION

FIGS. 2–4 show various other forms of the invention, and/or portions thereof;

GENERAL DESCRIPTION

The invention incorporates a range of technologies that enable greatly increased power density and information transport rates in electronic and microelectronic systems and subsystems. These increases are afforded by the use of woven meshes composed of electronic conductors, and by the transport of fluid in intimate contact with heat producing regions, via passages created by the mesh or meshes. Greatly improved heat transport rates and compliant interposers further the possibility of using thinned semiconductor die or dies and dies with two active sides. The invention may be used in conjunction with microelectronic, microelectromechanical, and/or microfluidic elements/arrays.

The invention enables increases in reliability and durability in addition to process intensification by lowering operating temperatures and thermal gradients and by providing increased mechanical compliance.

The improved meshes may be used in concert with existing two, two and one-half, and three dimension electronic packaging and interconnection processes, in applications including computing, power electronics, and lighting.

Modern electronic products and systems are limited by their ability to transport heat effectively to the local environment. The present invention seeks to remedy this by the introduction of woven meshes coplanar with, and in close proximity to a semiconductor die or dies, with fluid flow in the plane of the mesh screen and die, transferring the heat from the active region of the die to the local environment.

Cooling fluids may include liquids, vapors, and/or gasses, and may utilize phase change/s to aid in heat transport. Candidate internal heat transport fluids include water, alcohols, polyalphaolefins, polyphenylethers, polyphenylsiloxanes, and fluorinated liquids, such as those sold by 3M under the FLUORINERT label.

Pumping mechanisms include positive displacement, dynamic and shear force types. Microelectromechanical pumping schemes exploiting phenomena such as piezoelectric effect are attractive candidates. Pumps may be integrated with electronics to be cooled, or may be remotely placed as a part of a modular scheme. A single pump may be used to transport fluid to multiple electronic modules.

Wire meshes can greatly increase the effective area for heat transport and create a tortuous path or paths with a very small effective boundary layer and thereby greatly increase the heat transport rate from the die to the heat transport fluid.

The contemplated wire meshes may also act as electronic power and/or communication conduits, and thereby allow increased power density and communication rates. The meshes are typically made from high conductivity metal wires such as gold, silver, copper, and/or aluminum and may be plated to enhance coating adhesion and/or to improve electrical communication to contact regions and/or to aid processes such as soldering, wire bonding and/or adhesive bonding. Wires may be woven in square or triangular arrays and will typically have thin dielectric coatings to prevent electrical communication except where desired. Dielectric coating candidates include inorganic materials such as oxides, nitrides, and/or glasses, and/or organic coating materials such as Parylenes and/or commodity polymer coatings such as those used on "magnet wire". Dielectric coatings may be removed in regions where electrical communication is desired by means including LASERS and abrasives. Electrical communication to contact regions may be via means including pressure type contacts, electrically conductive adhesives, soldering, eutectic bonding, microwelding, and wirebonding.

An X-Y grid (row and column array) of conductors can allow selective electrical communication from its edges (wire ends) with any individual X-Y point where each X-Y point (node) contains a diode or switching element/s between the X and Y conductors. Diodes and/or switching element/s may be attached to the mesh and/or attached to the neighboring die and/or be an integral part of the die circuitry and electrically connected to the mesh X and Y wires at each node. Nodes may accommodate semiconductor emitters and/or detectors such as LASERs or Light Emitting Diodes (LEDs) and thereby allow high data rate communication between mesh nodes and/or mesh to die and/or die to die and/or to and from the die to remote elements.

A mesh composed of an X-Y grid of wires without diodes or switches at the nodes and insulated to prevent contact at crossing points is usable for providing electrical power and communication to the die on one or both sides of the mesh in addition to acting as a compliant interposer and providing increased heat transport. One possible arrangement is to have the wire array in one axis serve as electrical power conduits and the wire array in the other axis serve as electrical communication conduits. Many variants are possible via schemes such as multiplexing and mesh without diodes which may allow exploitation of complex electrical interaction more analogous to animal central nervous systems (neural nets) than to conventional digital electronic schemes.

Electrical

Woven wire mesh offers finer pitch than Ball Grid Array (BGA), Pin Grid Array (PGA), Land Grid Array (LGA), or wire bonding. Insulated metal wire is readily available in diameters <0.0005". Woven wire cloth is readily available in meshes sufficient to provide more than 1 million individually addressable nodes per square inch (>1500/mm$^2$) in systems that include diodes or semiconductor switches such as transistors at the nodes. Woven wire mesh grids may be fabricated with pitch varying with axis. Dutch weaves may be fabricated with an order of magnitude difference in pitch between axes. Such a configuration enables more efficient power provision to a grid via a coarse pitch of relatively large cross-section row conductors and a fine pitch of relatively small cross-section conductors.

The close die spacing enabled by the present invention means that the electrical communication path lengths are greatly reduced and this further results in much higher information transport rates.

Woven wire mesh may be much finer than corresponding contact array on die and thereby enables greater alignment tolerances while still assuring provision of at least one wire to electrically communicate with each pad and/or the increased number of wires in the mesh may allow increased electrical communication choices.

One configuration uses a woven wire mesh grid on the active side of die/s for communication and a backside grid for power provided through metallic vias.

Woven wire mesh arrays may also be used as a single electrical conductor on one side of a die for providing power or acting as a ground and/or an EMI/RFI shield.

Thermal

Woven wire mesh enables greatly increased area for heat transport.

Woven wire mesh enables increased heat transport by creating an array of narrow and tortuous fluid paths and thereby reducing the effective boundary layer thickness and its associated thermal resistance.

Fluid motion contemplated by the present invention may be effected by local boiling in fluid transport schemes analogous to classical or loop type heat pipes, or fluid may be forced by actively pumping to allow increased heat transport. The heat from the system is typically transferred to the local air stream, and this may be by free convection or by forced convection for increased heat transport rates. Forced convection cooling with phase change (boiling) and forced convection cooling of the air side of the heat exchange system enabling high heat transfer rates. For example, heat transport rates exceeding 10 KW/cm2 are possible. High power density microprocessors used in personal computers have thermal power densities ~15 W/cm2 and at this level present problems such as the ability to continue with the business as usual increases in power density associated with increased clock rates and denser transistor arrays.

Sub-ambient cooling is attractive or necessary for certain electronic or optoelectronic schemes and may be accomplished with the present technology via techniques including compression refrigeration and thermoelectrics.

The present invention presents designers and specifiers of electronic systems and subsystems with the ability to provide systems that transport heat effectively at very high rates, and thereby enable reductions in system cost, mass, and volume via denser packaging. For example 3D packaging has been used for memory die or dies in specific applications for many years but has been costly and could not be used with high power density die such as processors or power conversion devices. The present invention allows a high power density die to be stacked with as many layers as desired, while maintaining die temperatures consistent with high efficiency and long life.

Alternative high rate heat transport schemes such as "microchannel cooling" do not offer electrical conductor arrays, suffer from channel clogging without the means for the flow to pass around the restriction as in woven wire mesh, and have more difficulty providing proper heat transport with the thermal non-uniformities associated with integrated circuit die.

Wire mesh grids may be selectively filled with polymers to aid in flow organization for purposes such as optimizing heat transport in non-uniformly heated devices.

Mechanical/Structural

Thermo-mechanical failure is often cited as the dominant failure mechanism in microelectronic and optoelectronic systems. Thermal cycling, temperature gradients, and differences in thermal expansion coefficients between neighboring elements are contributors.

The woven wire mesh of the present invention acts as a mechanically compliant interposer between die and/or between die and other elements such as circuit boards or end plates via elastic and/or plastic deformation. The metals used for the wires in the array and the wire and array thermal and mechanical history may be chosen to provide mechanical compliance. Additional compliance may be realized by the use of wires with multiple strands, compliant dielectric coatings and/or by the use of conductive polymer or conductively coated polymer wires/filaments in one or more axes and/or by the use of very thin die to allow local elastic deformation at wire contact regions and/or by the use of elastomeric layers between a woven mesh and an inactive side of die or against an inactive element.

The use of pressure type contacts may further reduce thermomechanical failure and greatly simplify rework.

Thermoplastic and/or thermosetting polymers/elastomers may be integrated with meshes to increase mechanical stability and/or compliance.

Alignment is a significant concern in 3D electronics. Many 3D processes require the alignment of wafers before singulation. Proposed alignment means for the present invention assume singulation of die and die to mesh alignment rather than wafer to wafer or die to die alignment. Proposed means include:

- Self-alignment via solder surface tension. This mechanism is currently used with BGAs. Integrated circuit die typically have only one active surface and this may be aligned with wire mesh nodes by fixtures that fix the mesh and allow the die above and below the mesh to accommodate to the mesh via the surface tension of molten solder.
- Mesh with pitch much finer than die bond pads. This principle is usable with anisotropic conductive members.
- Mechanical vias and/or notches and minimal constraint fixtures. Meshes may have open regions for alignment pins, mechanical, electrical, optical, and/or fluid vias.
- Optical means used to align wafer to wafer for bonding.
- Combinations of the above means.

DETAILED DESCRIPTION

Figure 1:
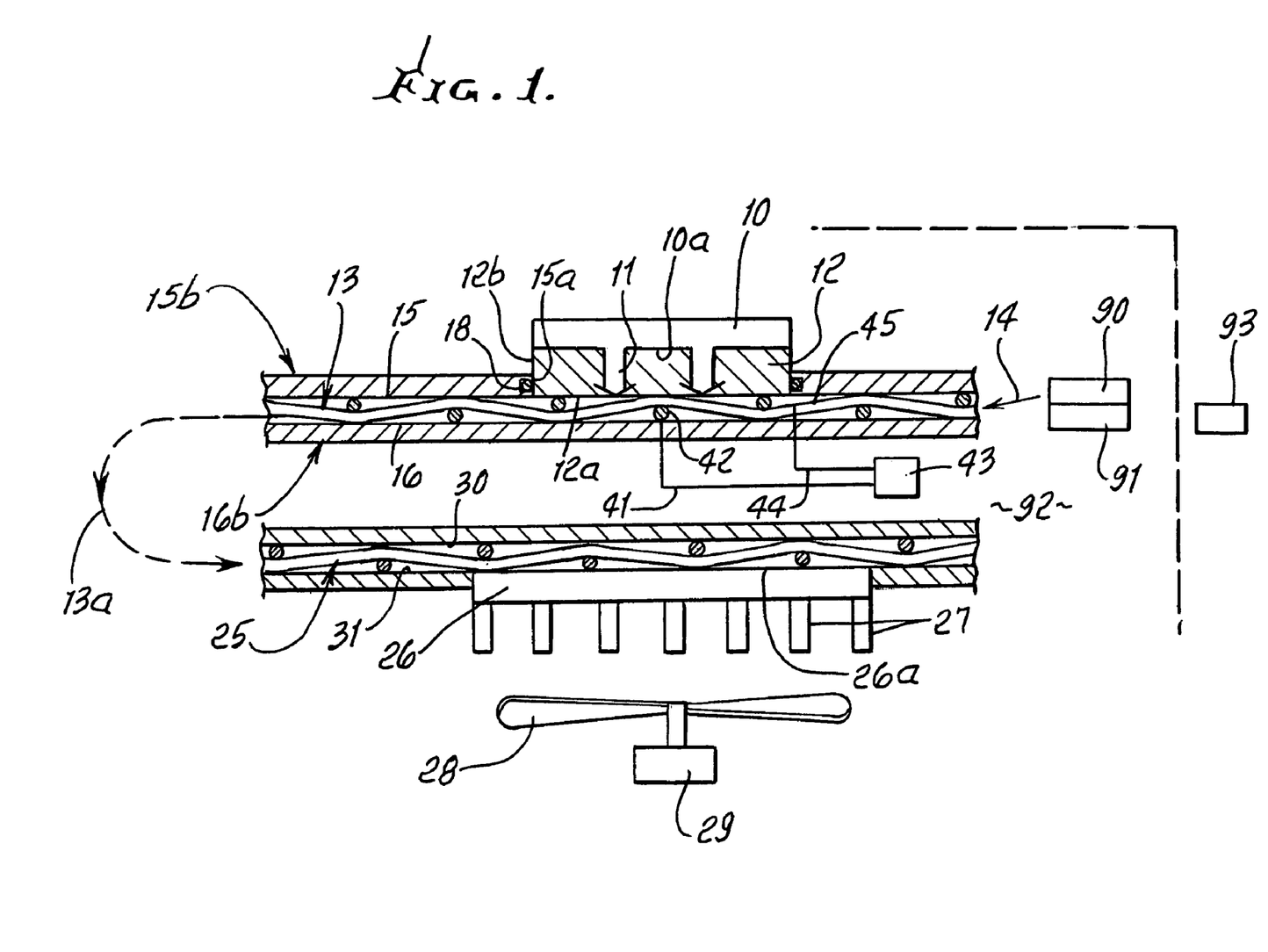
FIG. 1 illustrates the principles of a preferred form of the invention.
Figure 1A:
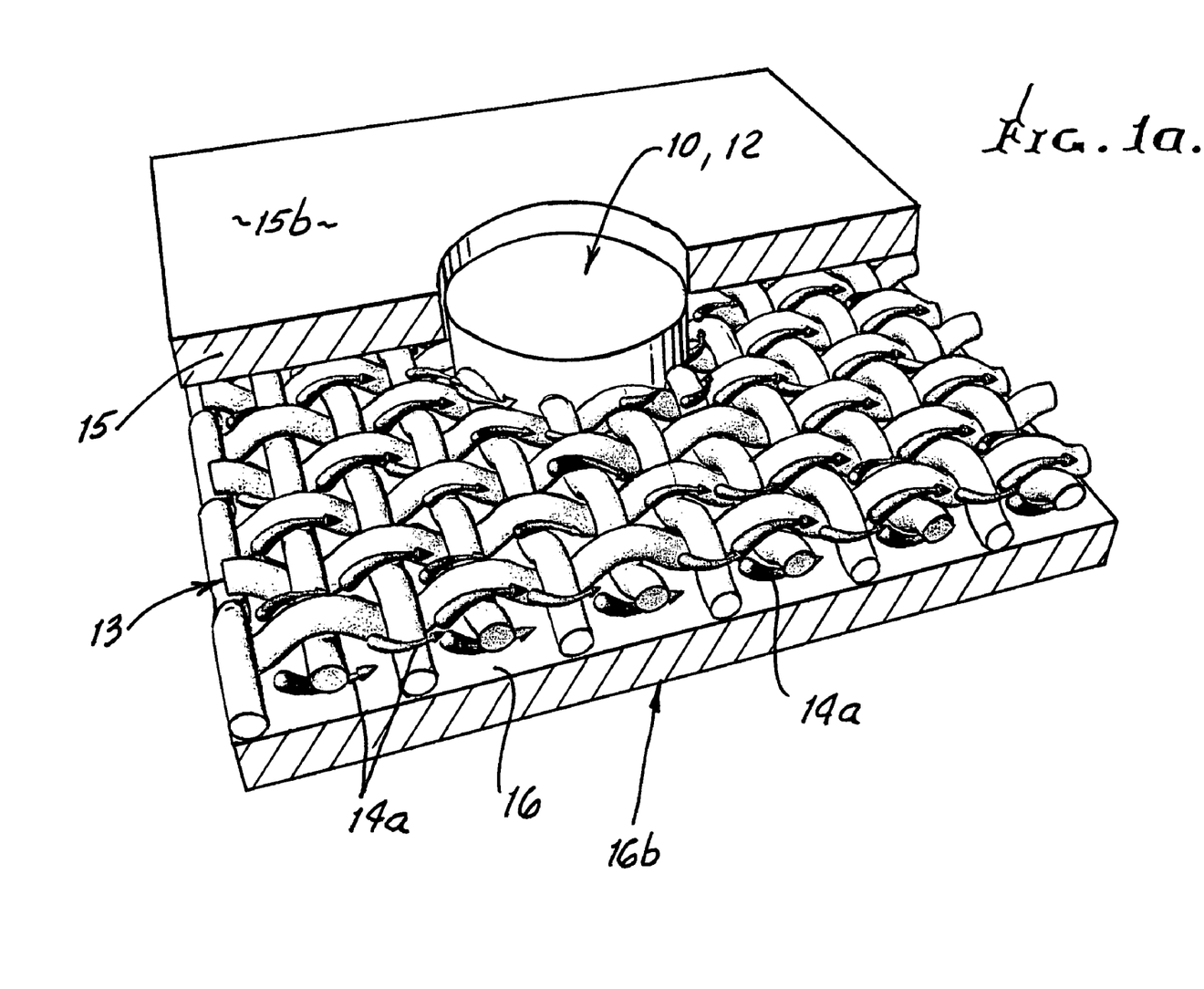
FIG. 1*a* is a perspective view of an electrical package such as a chip embedded in a mesh.

In FIG. 1, an electrical element or structure, such as a die or chip 10 in a microprocessor generates heat indicated by heat transfer arrows 11. After flowing through a heat spreader layer 12, such heat flows preferably to a mesh layer 13 located adjacent layer 12. The mesh wires may extend in heat transfer relation or conductive contact with the side 12a of layer 12, for efficient heat transfer, by conduction. FIG. 1a shows elements 10 and 12 embedded, or partly embedded or sunk in the mesh layer 13, to transfer heat to the mesh and to coolant fluid.

Coolant fluid indicated at 14 flows into and through the mesh, generally in the plane of the mesh, and through interstices between wires, and over and under wires, to efficiently remove heat from the mesh wires, whereby die or chip 10 is efficiently cooled, by a simple and highly compact assembly of components. Also, the coolant is directed by the mesh to flow in multiple tortuous streams, in heat scrubbing contact relation with the side or surface 12a of the spreader. See air flow arrows 14a in FIG. 1a. Therefore heat is picked up by the coolant in two ways; tortuous flow contact with the mesh wires and tortuous flow contact with surface 12a of the spreader. The spreader may be eliminated and the side 10a of the die or chip may be in contact with the mesh, as in FIG. 1a. Spreader 11 may consist of good heat conductive metal or metals, such as copper and/or tungsten, or alloys thereof. Pump 90, controlled at 91, effects transverse flow 14 in the mesh. Pump 90 may be inside cavity 92 and magnetically coupled to a motor 93 outside the cavity.

Flow of coolant fluid, such as air, may be directed edgewise is transversely through and in the plane of the mesh, as by conduit walls 15 and 16 at opposite sides of the mesh, the conduit elements indicated at 15b and 16b. Wall 15 may form an opening 15a to receive the spreader for contact with a side of the mesh layer as shown. The mesh composition may be as referred to above. Walls 15 and 16 may be heat insulative. A seal 18 may be employed and located at the boundary of the opening 15a, i.e. between surface 12b of 12, and surface 15a of 15, preventing escape of coolant from the interstices formed by the mesh wires.

Heat contained by the coolant is then removed as by transfer to ambient air outside the apparatus. See for example the preferred heat removal means in the form of a second mesh layer 25, or extension 13a of mesh layer 13, extending adjacent, and preferably in heat conductive contact, with body 26, having fins 27. Heat flows from the heated coolant passing edgewise through the mesh layer 25, to the mesh wires, and then by conduction to body 26 and to fins 27. Heat also flows from the coolant directly to surface 26a of body 26. Heat is removed from the fins by transfer to air driven against the fins, as by a fan 28 powered by motor 29. Conduit walls 30 and 31 extending at opposite sides of the mesh layer 25 confine the coolant to flow edgewise in the plane of that mesh 25 or 13a.

Mesh wires may be used for carrying electrical current, as for communication or other circuit purposes. See input or output wire 41 connected between mesh wire 42 and external communication circuit 43; and input or output wire 44 connected between mesh wire 45 and external circuit 43. Mesh wires 42 and 45 are interwoven, and extend in X and Y lateral directions. All such wires may be electrically insulated, but not thermally insulated. Wires 42 may serve for electrical communication or wires 45 may serve as electrical power wires.

Shear force pumps are preferred in part because in addition to the potential for being very compact, they can provide high pressure in a single stage and additionally act as efficient swept surface heat exchangers.

Pumping systems incorporating single glass disc rotors have been fabricated and tested, and are favorably characterized by the following:

Rotor stability: The clearance between the rotor and accompanying stator must be very small, especially with very low viscosity liquids such as 3M Fluorinerts and this requires accurate manufacture and a multiple bearing hub. There may be a positive feedback loop (Bernoulli Effect) causing the rotor to be increasing drawn toward a stator region with slightly small rotor to stator gap as a consequence of locally increased fluid velocity.

Rotor Heat Transport: If one side of the rotor is to act as a hot side swept surface heat exchanger and the other side of the rotor is to act as a cold side swept surface heat exchanger, the rotor should minimize the heat transport from one side to the other.

Figure 2:
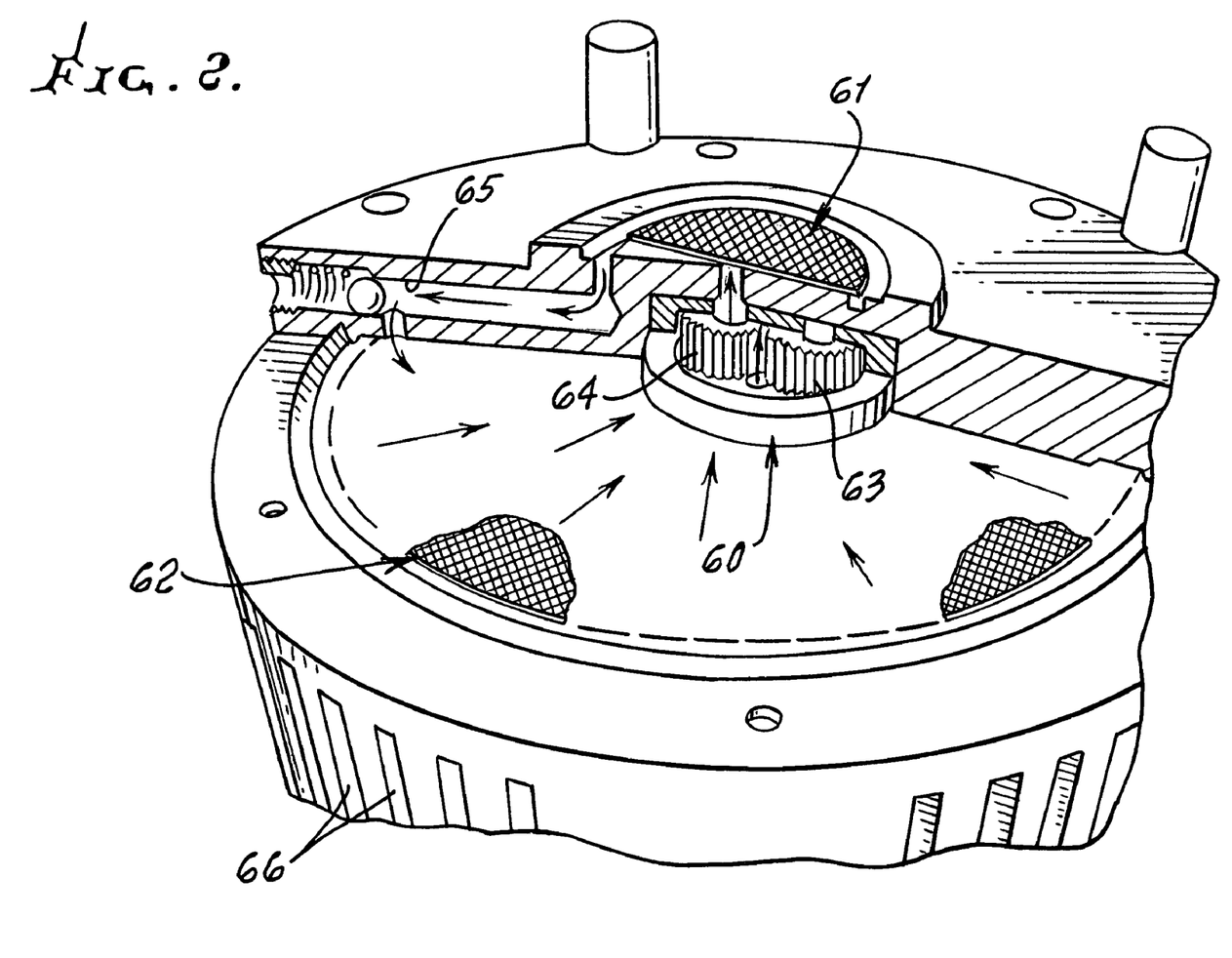

Rotor Durability: Glass rotors offer low cost, low thermal conductivity, and high stiffness to mass. A helical rotor dynamic pump is preferred FIG. 2 shows a coolant fluid pump 60 located between edge flow mesh 61 (corresponding to mesh 13) and substantially larger edge flow mesh 62 (corresponding to mesh 25). This pump has gears 63 and 64 with interfitting teeth rotating to produce positive displacement flow of coolant fluid, edgewise through first mesh 61, then to conduit 65 and to second mesh 62 for flow back to the inlet of the pump. Mesh 61 is a heat source side heat exchanger, and mesh 62 is a sink side heat exchanger. Structure corresponds functionally to that of FIG. 1, and fins 66 correspond to fins 27.

Figure 3:
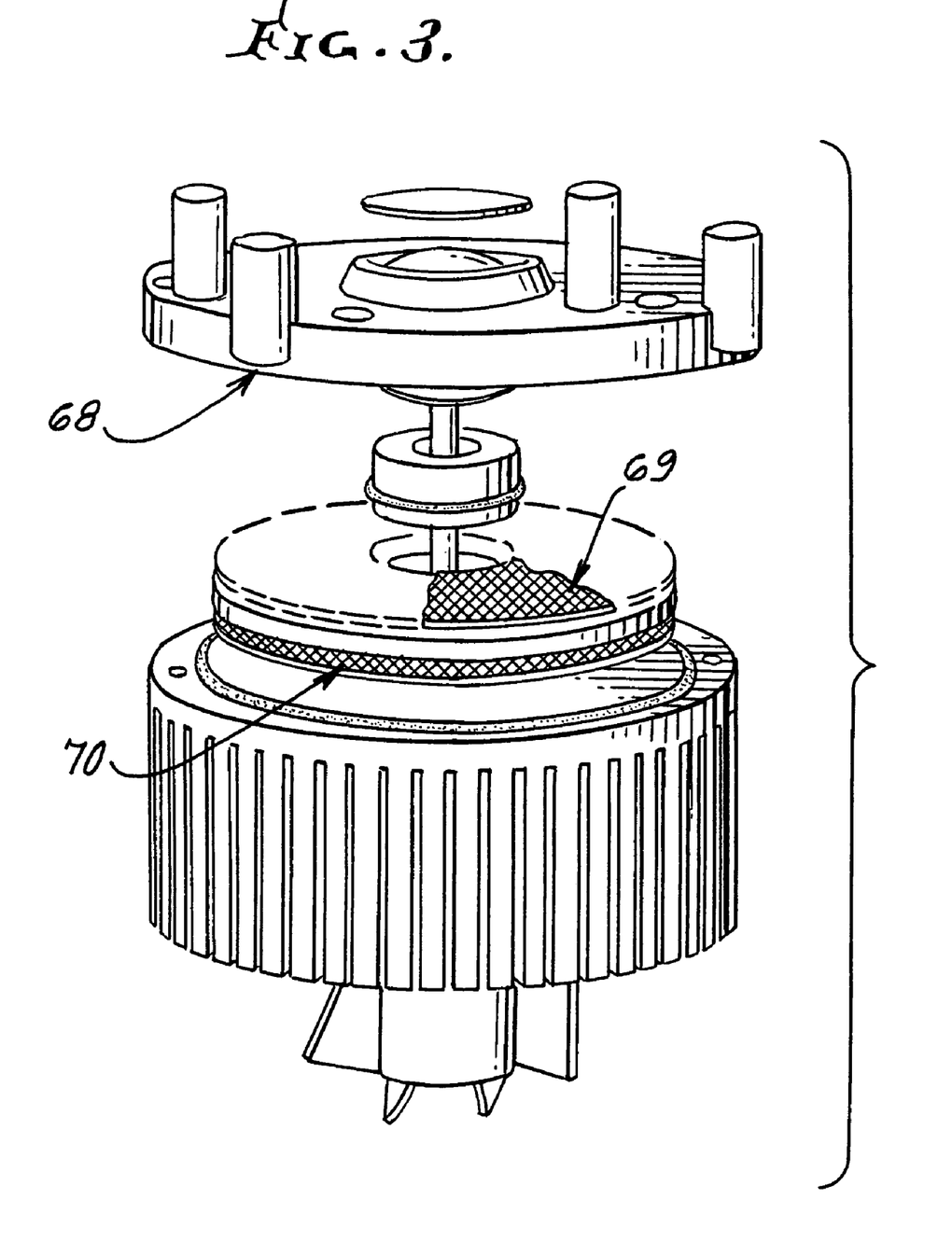

FIG. 3 is like FIG. 2, except that a shear force pump rotor 68 is used, instead of positive displacement gears. Edgewise flow in the planar meshes 69 and 70 correspond to flows in meshes 61 and 62.

FIG. 4 shows a modular system, supported on a computer or other electronic device, such as motherboard 75. The heat source mesh (like 13) is in a receptacle 76 overlying heat source circuit component 76 to be cooled; and the heat sink mesh is within receptacle 77 overlying the motherboard 75. Cooling fans (like 27) appear at 78. Coolant flows from the mesh in 76 to the mesh in 77, as via conduit 80; and coolant flows from a pump 82 in the fin structure 78 to the mesh in 77, or via a conduit 81.

Figure 5:
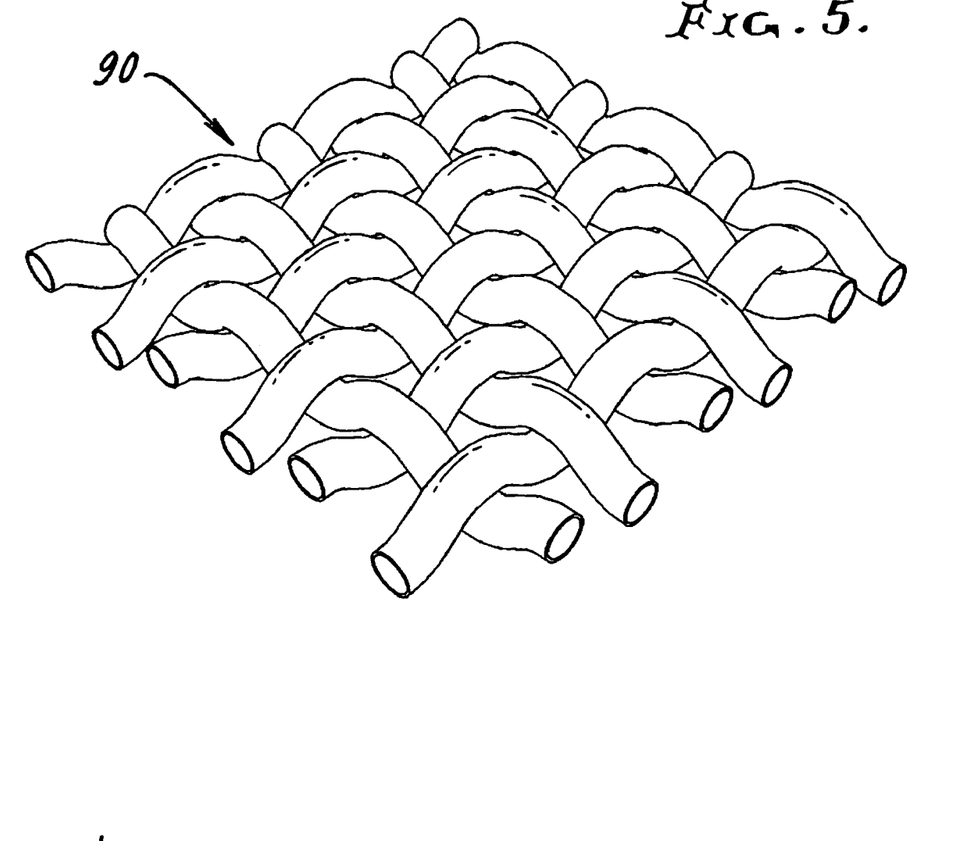
FIGS. 5–11 show mesh weave configuration.
Figure 6:
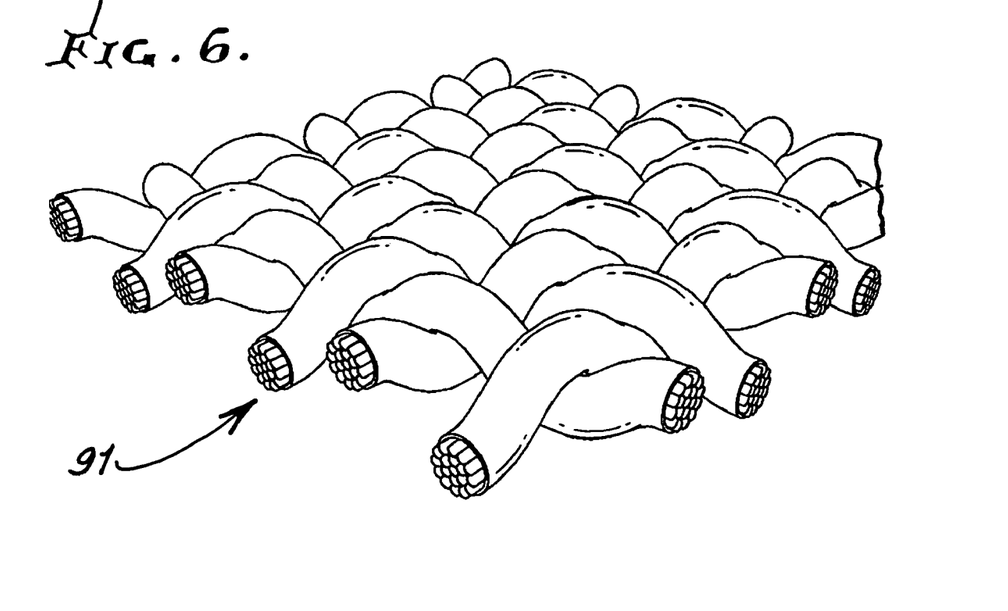
Figure 7:
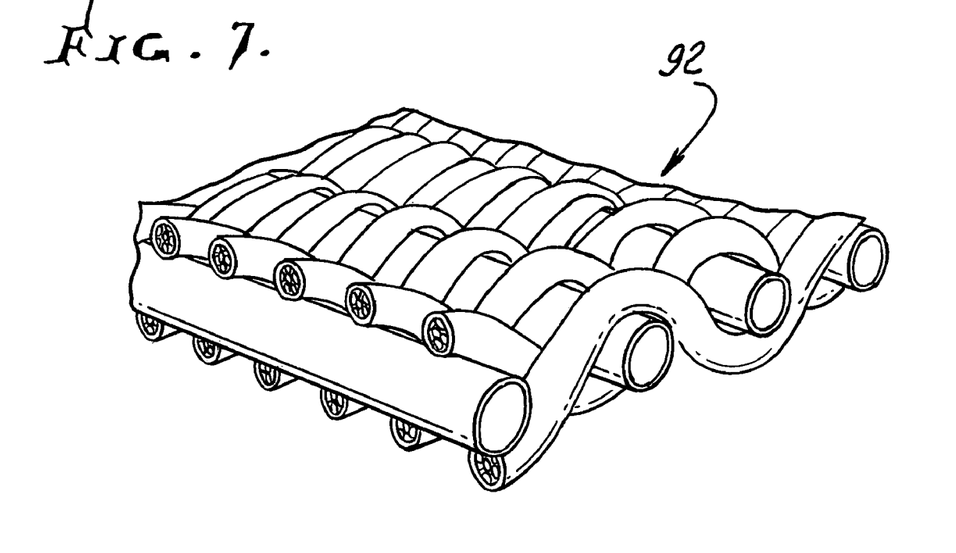
Figure 8:
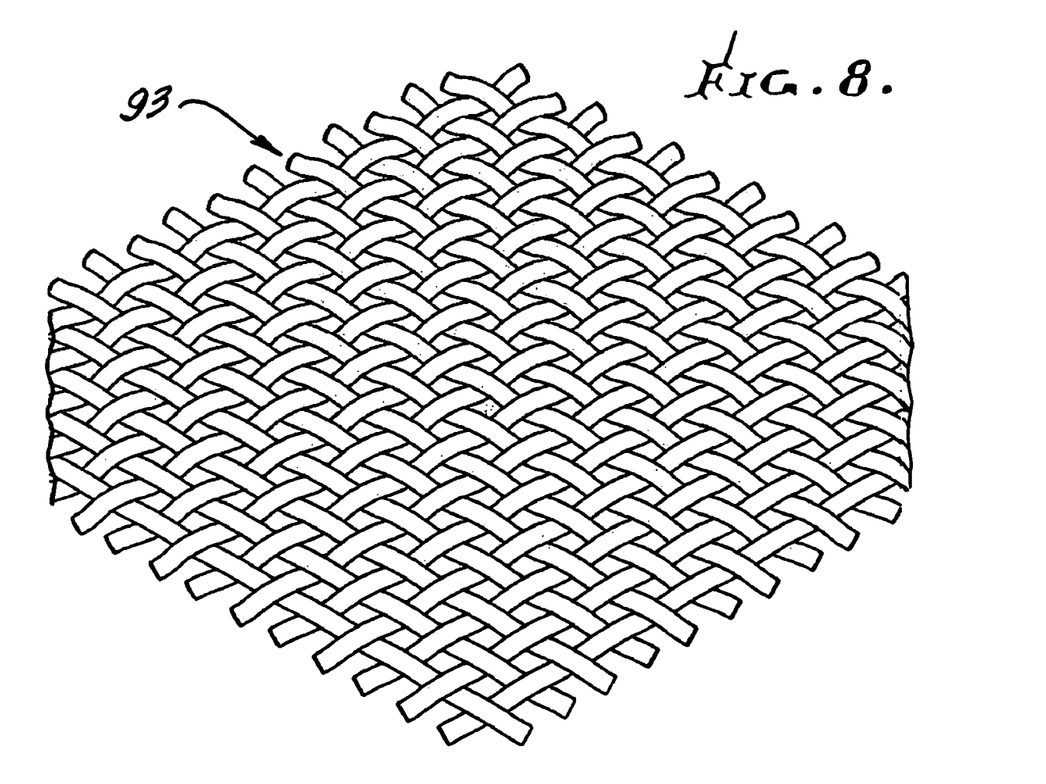
Figure 9:
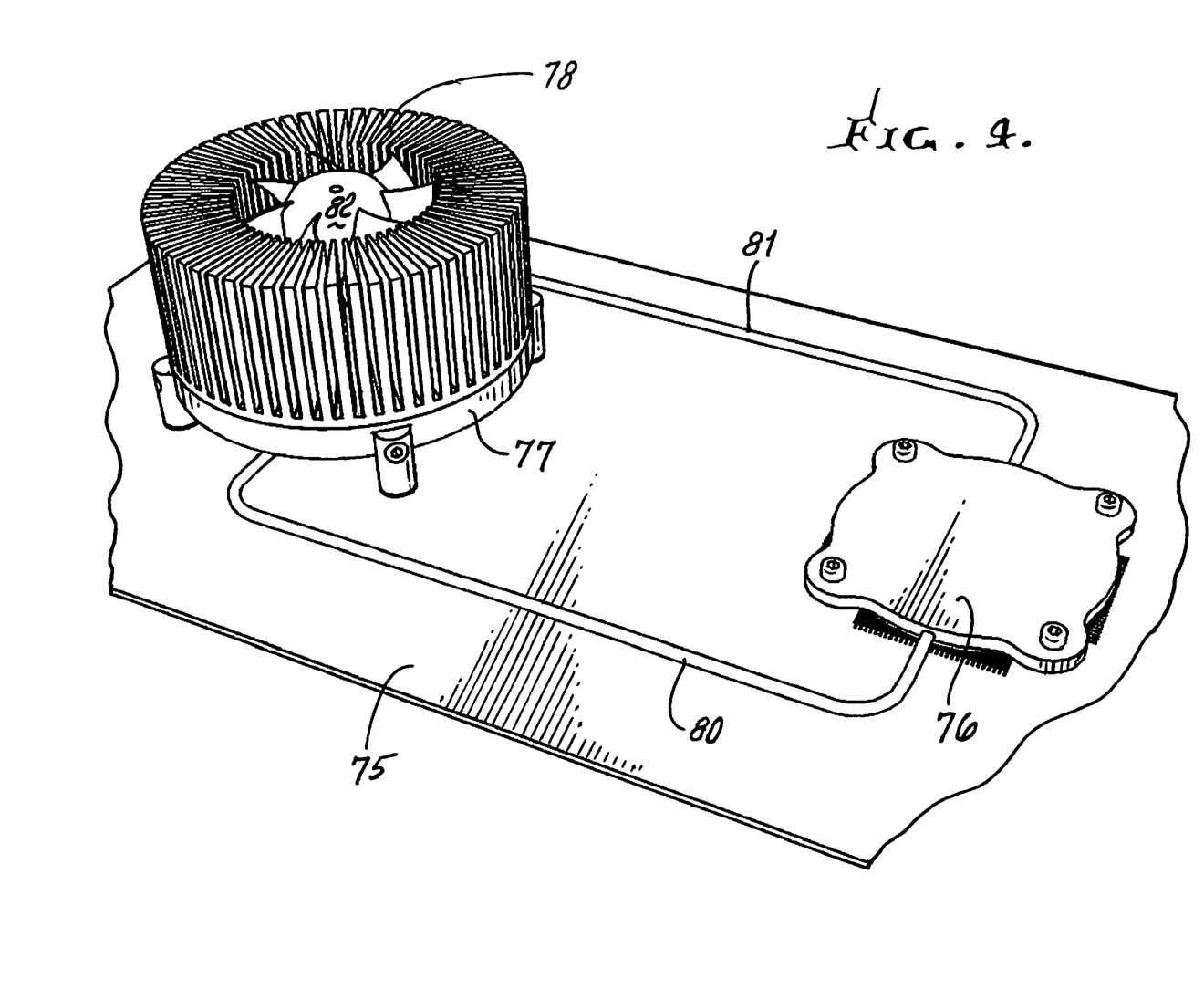
Figure 10:
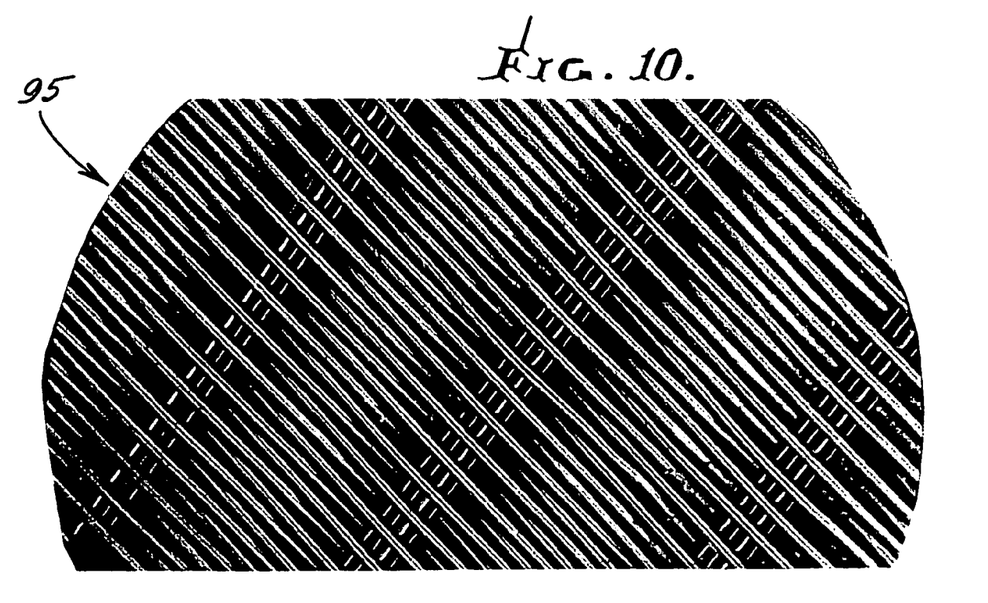
Figure 11:
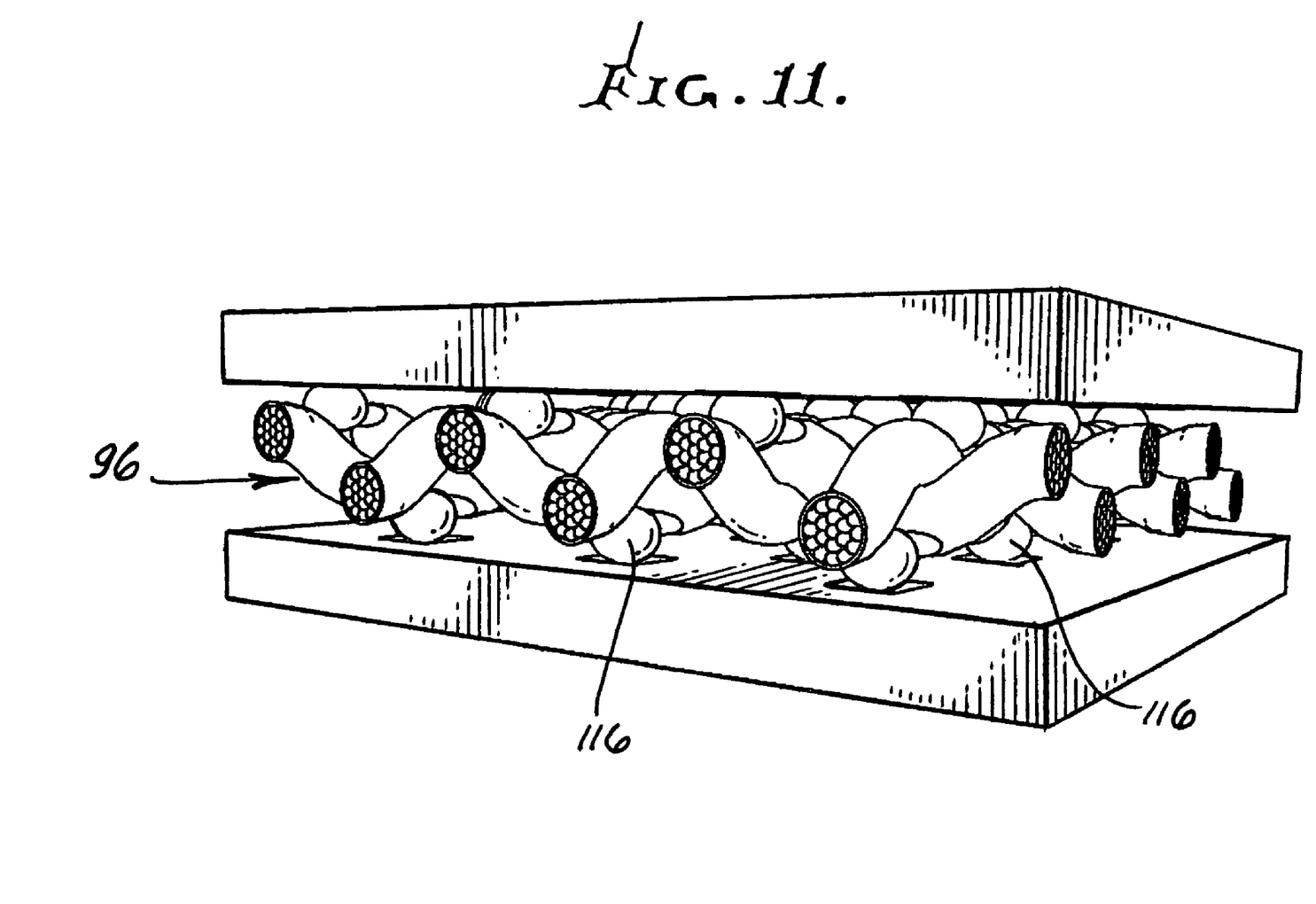

FIGS. 5–11 show various mesh weaves, identified as follows:

FIG. 5: mesh 90
FIG. 6: mesh 91
FIG. 7: mesh 92
FIG. 8: mesh 93
FIG. 9: mesh 94
FIG. 10: mesh 95
FIG. 11: mesh 96 (Note bonding balls 116.)

The present invention includes within its scope microchannel arrays created by woven meshes with fluid flow in the plane of the meshes.

Woven mesh arrays add an additional dimension to fluid flow and thereby allow diversion of flow around obstacles that would clog silicon microchannels. The meshes also act as microfluidic static mixers and cause the flowstreams to be periodically subjected to contact with first one confining layer and then the other. The addition of in plane 2D vs. 1D flow capability also provides the ability to create systems that include obstacles such as vias for electrical, mechanical, structural, fluid, thermal, and/or optical purposes.

Woven wire meshes are available in a wide range of materials, mesh sizes and weave styles. Copper wire cloth is a low cost commodity material with 3× the thermal conductivity of silicon and it is amenable to an wide range of manufacturing processes, including annealing, bending, blanking, brazing, coining, electric discharge machining, etching, insert molding, milling, plating, punching, rolling, shearing, soldering, stamping, tempering, and welding.

Woven meshes can act as mechanically/structurally compliant layers between materials with widely differing thermal expansion coefficients. This is an enormous benefit as thermomechanical failure is the dominant failure mechanism in microelectronics.

Woven wire meshes offer higher material thermal conductivity, better thermal coupling to the die, and greatly increased heat transfer area ratio multipliers for combined figures of merit for heat transported per unit pumping power greater than 10× silicon microchannel arrays.

The present invention allows a semiconductor die to have integrated circuits on both sides of the die by providing new and more effective means of heat transport, electrical power transport.

Increased heat transport rates should be seen as fundamental to process intensification in the electronics industry rather than as an emergency measure to reduce the operating temperature of critical components. In many instances increased heat transport rates are much more cost-effective than the alternatives. Microprocessors and graphic processors are examples of products that could be operated at greatly increased rates and be placed in closer proximity via improved heat transport means.

The present invention provides the means to transport heat from the active regions of semiconductors to the local environment at greatly reduced thermal resistances and at greatly increased heat transport rates by the imposition of meshes in close proximity or contact with the active regions and with fluid flow in the plane of the meshes.

Low cost heat transport systems offering the high thermal conductances and heat transport rates allowed by the present invention may dramatically accelerate the development of 3D electronics and cause a resurgence of interest and exploitation of semiconductor materials that have been neglected in part due to thermal considerations. Germanium is an example an electronic material candidate and cadmium selenide and zinc selenide are examples of optoelectronic material candidates that may benefit from the improved thermal conditions allowed by the present invention.

Electronic integrated circuits are typically created on thin planar substrates and this allows short thermal communication paths. 3D electronic assemblies are achieved by the stacking of semiconductor die to reduce system volume and/or to reduce the problems associated with long electron path lengths. 3D electronic assemblies have traditionally included one active die (high electrical and thermal power density) and a number of passive die (low electrical and thermal power density) to allow heat transport rates sufficient to maintain die temperatures associated with reasonable lifetimes. The present invention allows very large populations of very high power density die to be placed in very close proximity and thereby allowing the manufacture of processing, communication, and power conversion systems with greatly reduced cost, mass, and volume. In addition to the thermal issues associated with 3D electronic systems, they have also been costly to manufacture because of the difficulties associated with the large number of communication and power transport links required and the limited ability for rework. The present invention overcomes these traditional limitations and grants designers the ability to access a large number of locations on one or both faces of each die via interstitial meshes that provide periodic electronic and/or photonic conduits that can be easily coupled to input and/or output circuitry by extending the meshes beyond the die edges.

Means to provide mechanical compliance in the present invention include the use of elastically and/or plastically deformable metal meshes, meshes composed of metal wires in one axis and polymer electronic and/or photonic conductors in the opposite axis, and meshes composed of polymer electronic and/or photonic conductors in both axes.

Examples of materials for compliant metal meshes composed of metal wires in both axes include annealed copper, silver, and gold woven wire cloth with appropriate coatings/platings. Compliance may be enhanced by means including the use of polymer coatings, metallic platings, annealing, minimizing wire diameter (continuously and/or periodically) normal to the plane of the enclosing faces, and/or by the use of wires with differing ratios of resistance to elastic and plastic deformation in opposing axes and/or by the use of multiple wire conductors (stranded or multifilar).

Examples of materials for compliant meshes composed of metal wires in one axis and polymer fibers in the opposing axis include metal wires from the group that includes copper, nickel, silver, and gold with appropriate coatings/platings and polymer fibers in the opposite axis from the group that includes acrylics, silicones, urethanes, and polymethylpentenes.

Examples of materials for compliant meshes composed of polymer fibers in both axes include polymers such as acrylics, silicones, urethanes, and polymethylpentenes. Polymer fibers can be used as electronic and/or photonic conduits. Electrical conductivity in polymer fibers can be increased by the use of intrinsically conductive polymers, carbon addition, linear or helically wrapped metal wires, and/or conductive coatings/platings including transparent electrically conductive coatings such as indium tin oxide.

Enclosures for the proposed assemblages may be constructed from metals, polymers, ceramics, and/or glasses an the systems incorporating these assemblages may be divided into modular elements or integrated closely with additional elements including pumps for liquid flow and fans and fin arrays for transporting the heat from the active regions to the local environment.

Contact and communication between integrated circuit die and the proposed interstitial meshes can be provided by known means such as soldering and/or via pressure type contact. Pressure contact may be effected by the use of external springs or screws and/or by the elastoplastic deformation of the interstitial meshes.

I claim:

1. Apparatus for cooling of an electrical element package, comprising in combination
   a) structure including a hollow body, defining a cavity containing cooling fluid,
   b) the structure defining an opening or passage whereby direct contact of the cooling fluid with said package is established for heat transfer from the package to the fluid contained in the cavity,
   c) a mesh located to enhance said heat transfer,
   d) and means for circulating the fluid to transfer heat to other heat transfer means acting to remove heat from the fluid,
   e) and including a fluid seal between surfaces defined by the body and the package, adjacent said opening.

2. The combination of claim 1 said means including a pump acting to displace the fluid along a circulation path, associated with the cavity.

3. The combination of claim 2 wherein the pump is exposed to fluid in the cavity.

4. The combination of claim 3 wherein the pump has moving surfaces acting as fluid shear surfaces.

5. The combination of claim 3 including a motor located outside the cavity, for driving the pump.

6. The combination of claim 5 including magnetic coupling between the motor and the pump.

7. The combination of claim 5 including a housing, for said body and motor, heat transfer fins on the housing to receive heat transferred from the fluid to said housing, and means to displace cooling fluid in cooling relation to the fins.

8. Heat transfer apparatus comprising, in combination:
   a) a source of heat from electrical equipment, and having a heat transfer surface,
   b) a wire mesh extending proximate said surface to receive heat transfer therefrom, the mesh including certain wires, and other wires, said certain and other wires forming interstices,
   c) and means for passing a coolant fluid generally parallel to the mesh, for flow through said interstices, to receive heat transfer from the mesh,
   d) and including a second heat transfer mesh receiving said coolant fluid that flows from the first mentioned mesh, and other means for transferring heat from the second mesh,
   e) and wherein said other means includes coolant fluid passing through said second mesh, generally parallel to a plane defined by the second mesh.

9. The combination of claim 8 wherein said means includes fins to which heat is transferred from fluid that has passed through the second mesh, and a fan circulating air over said fins.

10. Heat transfer apparatus comprising, in combination:
    a) a source of heat from electrical equipment, and having a heat transfer surface,
    b) a wire mesh extending proximate said surface to receive heat transfer therefrom, the mesh including certain wires, and other wires, said certain and other wires forming interstices,
    c) and means for passing a coolant fluid generally parallel to the mesh, for flow through said interstices, to receive heat transfer from the mesh,
    d) and wherein said mesh is a first mesh, and including a second mesh receiving coolant fluid from the first mesh, for receiving heat therefrom and for transferring heat to heat dissipating means,
    e) and wherein said first mesh is substantially planar, and said coolant fluid flows within the first mesh in the direction or directions of planar extent thereof, and said second mesh is substantially planar and said coolant fluid flows within the second mesh in the direction or directions of planar extent thereof.

11. The combination of claim 10 wherein the second mesh is one of the following:
    i) spaced from the first mesh,
    ii) is a continuation of said first mesh.

12. The combination of claim 10 including a fluid coolant pump located between said first and second meshes.

13. The combination of claim 10 wherein at least one of said first and second meshes has interwoven strands forming interstices through which coolant fluid flows.

14. The combination of claim 13 wherein said interwoven strands include multiple sub-strand heat conductors.

15. The combination of claim 13 wherein said strands form at least one of the following:
    i) a Dutch weave pattern;
    ii) a diamond weave pattern;
    iii) a triaxial weave pattern.

16. The combination of claim 13 including bonding balls on certain of the strands.

17. An apparatus for cooling an integrated circuit having a package, said apparatus being attachable to the integrated circuit and having a hollow body, wherein a cavity formed by said hollow body contains fluid for cooling of the integrated circuit through an opening of the cavity, and at the surface making contact between the cooling apparatus and the integrated circuit, so that the fluid is in direct contact with the integrated circuit's package.

18. The apparatus of claim 17 where the fluid is moved inside the cavity by a pump.

19. The apparatus of claim 18 where the pump is driven by a magnetic coupling to an external motor.

20. The apparatus of claim 17 where the opening of the cavity is substantially circular, and including a seal between the integrated circuit and the cooling device's cavity established by an O-ring.

21. The apparatus of claim 17, where a micro-mesh covers the opening of the cavity.

22. The apparatus of claim 21 where the micro-mesh uses a dutch weaving pattern.

23. The apparatus of claim 21 where the micro-mesh uses a diamond weaving pattern.

24. The apparatus of claim 21 where the micro-mesh uses a triaxial weaving pattern.

25. The apparatus of claim 21 where the micro-mesh uses a weaving pattern with sub-conductors.

26. The apparatus of claim 21 where the micro-mesh uses a weaving pattern with attached bonding balls.

27. The apparatus of claim 21 where the fluid is moved inside the cavity by a pump therein.

28. The apparatus of claim 27 where the pump is driven by magnetic coupling to an external motor.

29. The apparatus of claim 21, where the pump is a displacement pump.

30. The apparatus of claim 21, where the pump has a shearing surface.

31. The apparatus of claim 19 where the external motor drives a fan displacing air over cooling fins receiving heat transfer from a mesh that passes said coolant fluid.

32. The apparatus of claim 31 where the coolant fluid is a low viscosity fluorocarbonate.

33. The apparatus of claim 17 including a mesh proximate said opening and having wires, and electrical circuitry in electrical communication with at least some of said mesh wires.

34. Heat transfer apparatus comprising, in combination:
a) a source of heat from electrical equipment, and having a heat transfer surface,
b) a wire mesh extending proximate said surface to receive heat transfer therefrom, the mesh including certain wires, and other wires, said certain and other wires forming interstices,
c) and means for passing a coolant fluid generally parallel to the mesh, for flow through said interstices, to receive heat transfer from the mesh,
d) and wherein said mesh is a first mesh, and including a second mesh receiving coolant fluid from the first mesh, for receiving heat therefrom and for transferring heat to heat dissipating means,
e) and wherein the heat dissipating means includes another fluid operable to change phase upon receiving heat transfer from the coolant fluid.

35. Heat transfer apparatus comprising, in combination:
a) a source of heat from electrical equipment, and having a heat transfer surface,
b) a wire mesh extending proximate said surface to receive heat transfer therefrom, the mesh including certain wires, and other wires, said certain and other wires forming interstices,
c) and means for passing a coolant fluid generally parallel to the mesh, for flow through said interstices, to receive heat transfer from the mesh,
d) and including a second heat transfer mesh receiving said coolant fluid that flows from the first mentioned mesh, and other means for transferring heat from the second mesh,
e) and including a polymer selectively filled into at least a portion or portions of at least one of said meshes for coolant fluid flow organization.

36. Heat transfer apparatus comprising, in combination:
a) a source of heat from electrical equipment, and having a heat transfer surface,
b) a wire mesh extending proximate said surface to receive heat transfer therefrom, the mesh including certain wires, and other wires, said certain and other wires forming interstices,
c) and means for passing a coolant fluid generally parallel to the mesh, for flow through said interstices, to receive heat transfer from the mesh,
d) and wherein said mesh is a first mesh, and including a second mesh receiving coolant fluid from the first mesh, for receiving heat therefrom and for transferring heat to heat dissipating means,
e) and wherein said first mesh is substantially planar, and said coolant fluid flows within the first mesh in the direction or directions of planar extent thereof, and said second mesh is substantially planar and said coolant fluid flows within the second mesh in the direction or directions of planar extent thereof,
f) and including a fluid coolant pump located between said first and second meshes,
g) and wherein said pump has a glass disc rotor.

37. Apparatus for cooling of an electrical element package, comprising in combination
a) structure including a hollow body, defining a cavity containing cooling fluid,
b) the structure defining an opening or passage whereby direct contact of the cooling fluid with said package is established for heat transfer from the package to the fluid contained in the cavity,
c) a mesh located to enhance said heat transfer,
d) and means for circulating the fluid to transfer heat to other heat transfer means acting to remove heat from the fluid,
e) and wherein the package is at least in part embedded or sunk in the mesh.

* * * * *